(12) United States Patent
Inoue et al.

(10) Patent No.: US 6,492,923 B1
(45) Date of Patent: Dec. 10, 2002

(54) TEST SYSTEM AND TESTING METHOD USING MEMORY TESTER

(75) Inventors: Takato Inoue, Hyogo (JP); Masatoshi Maga, Tokyo (JP); Hisayoshi Hanai, Tokyo (JP); Shinji Yamada, Hyogo (JP)

(73) Assignees: Mitsubishi Denki Kabushiki Kaisha, Tokyo (JP); Ryoden Semiconductor System Engineering Corporation, Hyogo (JP)

(*) Notice: Subject to any disclaimer, the term of this patent is extended or adjusted under 35 U.S.C. 154(b) by 0 days.

(21) Appl. No.: 10/135,442

(22) Filed: May 1, 2002

(30) Foreign Application Priority Data

Nov. 1, 2001 (JP) .......................................... 2001-336354

(51) Int. Cl.[7] ............................................... H03M 1/10
(52) U.S. Cl. ........................ 341/120; 341/155; 341/144; 341/126; 341/94; 714/30; 714/743; 714/725; 714/728; 714/738; 714/718; 714/724; 365/201
(58) Field of Search .......................... 341/120, 94, 126, 341/144, 155; 714/30, 37, 725, 728, 738

(56) References Cited

U.S. PATENT DOCUMENTS

| | | | | |
|---|---|---|---|---|
| 5,453,995 A | * | 9/1995 | Behrens ....................... 714/743 |
| 5,835,506 A | * | 11/1998 | Kuglin ......................... 714/724 |
| 5,956,280 A | * | 9/1999 | Lawrence .................... 324/73.1 |
| 6,000,048 A | * | 12/1999 | Krishna et al. .............. 714/718 |
| 6,028,439 A | * | 2/2000 | Arkin et al. ................. 324/537 |
| 6,101,620 A | * | 8/2000 | Ranganathan ................ 714/718 |
| 6,282,145 B1 | * | 8/2001 | Tran et al. ............. 365/230.06 |
| 6,388,929 B1 | * | 5/2002 | Shimano et al. ............. 365/201 |
| 6,404,684 B2 | * | 6/2002 | Arimoto et al. ............. 365/201 |

FOREIGN PATENT DOCUMENTS

| | | |
|---|---|---|
| JP | 11-258312 | 9/1999 |
| JP | 2001-93295 | 4/2001 |

* cited by examiner

*Primary Examiner*—Michael Tokar
(74) *Attorney, Agent, or Firm*—McDermott, Will & Emery

(57) ABSTRACT

A memory tester including an algorithmic pattern generator (ALPG) for generating a test pattern as a digital signal based on vector data is provided with a digital-to-analog converter built in the memory tester or provided outside the memory tester. Thus, the function of a device under test (DUT) having the analog-to-digital converting function can be verified. In other words, an address signal included in the test pattern generated in the ALPG is used for generating an analog signal to be input to the DUT having the analog-to-digital converting function, not for address designation. A control unit compares an output digital signal generated in the DUT with the address signal generated in the ALPG as a test digital signal to detect the degree of agreement between these signals, thereby verifying the analog-to-digital converting function of the DUT. Consequently, a test system and a testing method capable of testing the analog-to-digital or digital-to-analog converting function of the DUT using the memory tester are obtained.

10 Claims, 13 Drawing Sheets

```
      X ADDRESS     Y ADDRESS    DATA
     ‾‾‾‾‾‾‾‾‾     ‾‾‾‾‾‾‾‾‾    ‾‾‾‾
    (0000 0000 ,  0000 0000 ,   0)
    (0000 0001 ,  0000 0000 ,   1)
    (0000 0010 ,  0000 0000 ,   0)
                      ⋮
    (0000 0000 ,  0000 0001 ,   1)
    (0000 0001 ,  0000 0001 ,   0)
    (0000 0010 ,  0000 0001 ,   1)
                      ⋮
    (1111 1111 ,  1111 1111 ,   0)
```

FIG. 15

(MMMMMM, NNNNNNN, D, XM=XM+1, YN=YN+1, CHK)
  X ADDRESS  Y ADDRESS  DATA  X ADDRESS       Y ADDRESS       PATTERN NAME
                              INCREMENT       INCREMENT
                              EQUATION        EQUATION

TEST SYSTEM AND TESTING METHOD USING MEMORY TESTER

BACKGROUND OF THE INVENTION

1. Field of the Invention

The present invention relates to a memory tester for verifying operations of a semiconductor memory by detecting whether or not a predetermined expected value is sent back when a predetermined signal is supplied to the semiconductor memory.

2. Description of the Background Art

A memory tester and a logic tester exemplify a semiconductor integrated circuit testing apparatus for testing a semiconductor integrated circuit such as a memory or a logic LSI (large scale integration). As indicated by their names, a memory tester is an apparatus for testing whether or not a memory operates normally, and a logic tester is an apparatus for testing whether or not a logic LSI operates normally.

On the other hand, semiconductor integrated circuits for image processing and for mobile communications are desired to have the capability of processing both of an analog signal and a digital signal. Thus, an analog/digital mixed LSI (mixed signal LSI) containing an analog signal processing part and a digital signal processing part is employed for such circuits. The mixed signal LSI is generally provided with a digital-to-analog converter for converting a digital signal into an analog signal and an analog-to-digital converter for converting an analog signal into a digital signal.

To test a device having the analog-to-digital (A/D) converting function and digital-to-analog (D/A) converting function such as the mixed signal LSI, an analog signal as well as a digital signal needs to be used. Thus, a mixed signal tester capable of outputting both of digital and analog signals is employed for this purpose.

FIG. 10 illustrates an exemplary structure of such mixed signal tester. A mixed signal tester T2 comprises: a control unit 10; a digital-to-analog (D/A) converter 11 for converting a digital signal S10 output from the control unit 10 into an analog signal S11 and outputting the signal to the outside; and an analog-to-digital (A/D) converter 12 for converting an analog signal S14 input from the outside into a digital signal S15 and outputting the signal to the control unit 10.

The control unit 10, which represents a central processing unit (CPU) or a digital signal processor (DSP) to which storing means (e.g., a read-only memory (ROM) and a random access memory (RAM)) is connected, is a functional component operated by predetermined software programs stored in the ROM and RAM. The control unit 10 controls the D/A converter 11 and the A/D converter 12, while exchanging a digital signal S12 with the outside via another path different from one leading to the D/A converter 11.

A device under test (DUT) 200 serving as the mixed signal LSI is connected to the mixed signal tester T2 through pin electronics PE. The pin electronics PE serve as an interface circuit for transmitting a signal from the mixed signal tester T2 to each pin of the DUT 200 and an output signal from each pin of the DUT 200 to the mixed signal tester T2. The pin electronics PE generally comprise, per pin, a driver DR for controlling a signal from the mixed signal tester T2 and a comparator CP for detecting whether an output signal from each pin of the DUT 200 has a value greater (or smaller) than a predetermined value.

To operate the driver DR and the comparator CP, a voltage source VS is provided, whose potentials at its both terminals are indicated by first and second reference potentials V1 and V2, respectively.

FIG. 11 illustrates an exemplary structure of the comparator CP. The comparator CP includes a High-side comparator C1 and a Low-side comparator C2. One side input terminals of the High-side comparator C1 and the Low-side comparator C2 are both supplied with an output signal S13 from the DUT 200. The other input terminal of the High-side comparator C1 is supplied with the first reference potential V1 through a High-side pad P1, and that of the Low-side comparator C2 is supplied with the second reference potential V2 through a Low-side pad P2.

Output signals S12a and S12b of the High-side comparator C1 and the Low-side comparator C2 are transmitted to the control unit 10, respectively, as the digital signal S12. The control unit 10 judges whether a malfunction occurs in the DUT 200 in accordance with the transmitted result. In the case that the signal S13 from the DUT 200 is an analog signal and thus no comparison need to be made at the comparator CP, the analog signal is output as the signal S14 from the pin electronics PE to the A/D converter 12 included in the mixed signal tester T2.

The mixed signal tester is capable of processing both digital and analog signals 15 and thus have improved convenience, whereas it is expensive due to the complexity of its device structure and that of information processing performed therein.

On the other hand, a memory tester, which processes a digital signal alone, is inexpensive because of its simple device structure and simple information processing compared to those of the mixed signal tester. However, the memory tester is incapable of processing an analog signal, and thus, incapable of testing a device having the A/D converting function and D/A converting function such as the mixed signal LSI.

FIG. 12 illustrates an exemplary structure of the memory tester. The memory tester T1c comprises: a control unit 1; an algorithmic pattern generator (ALPG) 2 for generating, on the basis of vector data VD, a test pattern as a digital signal to be supplied to a memory cell in each address in a DUT 300 serving as a memory; and a fail bit analyzer (FBA) 3 for analyzing a failure position in the DUT 300 when a failure is found in an output of the DUT 300, thereby replacing the failure position with a redundant circuit included in the DUT 300.

The control unit 1, which represents a CPU or a DSP to which storing means (e.g., ROM and RAM) is connected, is a functional component operated by predetermined software programs stored in the ROM and RAM. The control unit 1 controls the ALPG 2 and the FBA 3.

The DUT 300 is connected to the memory tester T1c through the pin electronics PE similar to those illustrated in FIG. 10. Each of signals from the ALPG 2 (an address signal S1a and a data signal S1b, both of which are 8-bit digital signals, for example) is transmitted to the DUT 300 through the pin electronics PE as a signal S2.

FIG. 13 is a flow chart showing an operation of the memory tester T1c. First, a test pattern to be supplied to the DUT 300 is designated as vector data VD and is input to the control unit 1 (step ST1). The vector data here represents data for designating what type of data (e.g., "0" or "1") is to be stored in each of a plurality of memory cells arranged in row and column directions in the DUT 300.

Concrete examples of the vector data VD are shown in FIGS. 14 and 15. FIG. 14 shows an example of vector data that designates the contents of data for each memory cell by "0" or "1" in binary. FIG. 15 shows another example of vector data that designates the contents of data for each memory cell by applying a predetermined rule.

The respective vector data shown in FIGS. 14 and 15, whose X (row) addresses and Y (column) addresses are designated by, e.g., 8 bits, respectively, have data patterns like a checker flag (in which data is aligned with the contents inverted alternatingly as "0", "1", "0", "1" . . . both in the X and Y directions). The vector data shown in FIG. 14 has the data contents inverted alternatingly as "0", "1", "0", "1" . . . in the same Y address as the X addresses increase one by one. Invoked in the vector data shown in FIG. 15 is a program having a pattern name of CHK in which an algorithm for previously generating a pattern like a checker flag (e.g., algorithm for inputting data "1" to memory cells having X and Y addresses both in odd coordinates and those having X and Y coordinates both in even coordinates, while inputting data "0" to other memory cells) is stored.

The ALPG 2 exchanges a signal S0 with the control unit 1, thereby receiving controlling information and information on vector data VD from the control unit 1 and providing the control unit 1 with information on the operating condition thereof. The ALPG 2 then generates a test pattern on the basis of the vector data VD (step ST2), and supplies the pattern to the DUT 300 (step ST3c). More specifically, the ALPG 2 supplies the address signal S1a and the data signal S1b to the DUT 300 as the signal S2 through the pin electronics PE. Although illustration is omitted, the ALPG 2 also outputs a control signal to the DUT 300.

On the other hand, the signal S2 includes a signal output from the DUT 300 to the pin electronics PE. The output signal is input to the FBA 3 through the pin electronics PE as a signal S5.

The FBA 3 analyzes a failure position. The result of analysis is supplied to the control unit 1 as a signal S6 together with the output signal of the DUT 300. The control unit 1 verifies whether the output signal from the DUT 300 is in accordance with 20 the test pattern generated in the ALPG 2 (step ST4c).

It is desirable that a digital tester such as the above-described memory tester be capable of testing a device having the A/D converting function and D/A converting function such as the mixed signal LSI.

SUMMARY OF THE INVENTION

An object of the present invention is to provide a test system and a testing method capable of testing the A/D converting function or D/A converting function of a device under test using a memory tester which is less expensive than a mixed signal tester.

A first aspect of the present invention is directed to a test system. The test system includes a memory tester and a digital-to-analog converter. The memory tester includes a test pattern generating section for generating a predetermined test pattern to be supplied to a memory cell in each address in a memory device and a control unit for controlling the test pattern generating section. The digital-to-analog converter is one of digital-to-analog converters, one built in the memory tester and the other provided outside the memory tester. In the test system, the control unit is supplied with vector data for generating the predetermined test pattern. The test pattern generating section generates the predetermined test pattern on the basis of the vector data. A test digital signal included in the predetermined test pattern is converted into a test analog signal by the digital-to-analog converter to be supplied to a device under test having the analog-to-digital converting function. And the control unit compares the test digital signal with an output digital signal generated in the device under test by converting the test analog signal, thereby verifying the analog-to-digital converting function of the device under test.

In the test system, the test digital signal included in the predetermined test pattern is converted into the test analog signal by the digital-to-analog converter and to be supplied to the device under test. The control unit compares the test digital signal with the output digital signal generated in the device under test by converting the test analog signal, thereby verifying the analog-to-digital converting function of the device under test. This allows the memory tester to perform testing of the analog-to-digital converting function of the device under test.

Preferably, the test system further includes a storage device for storing the output digital signal and outputting the signal to the control unit.

In the test system, the storage device for storing the output digital signal and outputting the signal to the control unit is further provided. Thus, the control unit does not need to make a real-time comparison between the output digital signal and the test digital signal.

Preferably, in the test system, the storage device is a memory provided in a fail bit analyzer for analyzing a failure position in the memory device when a failure is found in an output of the memory device.

In the test system, the storage device is the memory provided in the FBA. Thus, there is no need to provide an additional storage device for the memory tester, but the memory provided inside the FBA which is generally built in the memory tester can be diverted for the storage device.

Preferably, in the test system, the control unit, in the comparison between the output digital signal and the test digital signal, judges that analog-to-digital conversion functions normally in the device under test when the signals are different only within a predetermined range of numerical values.

In the test system, the control unit, in the comparison between the output digital signal and the test digital signal, judges that analog-to-digital conversion functions normally in the device under test when the signals are different only within a predetermined range of numerical values. Thus, the percentage of devices under test passing a test can be increased by setting the predetermined range appropriately.

A second aspect of the invention is directed to another test system includes a memory tester and pin electronics. The memory tester includes a test pattern generating section for generating a predetermined test pattern to be supplied to a memory cell in each address in a memory device and a control unit for controlling the test pattern generating section. The pin electronics include a first digital-to-analog converter and a first comparator. In the test system, the control unit is supplied with vector data for generating the predetermined test pattern. The test pattern generating section generates the predetermined test pattern on the basis of the vector data. A test digital signal included in the predetermined test pattern is supplied to a device under test having the digital-to-analog converting function. A predetermined digital value designated by the control unit is converted into a first reference analog signal by the first digital-to-analog converter to be input to one input terminal of the first comparator. An output analog signal generated in the device under test by converting the test digital signal is input to the other input terminal of the first comparator. The first comparator compares the output analog signal generated in the device under test with the first reference analog signal, thereby supplying the result of comparison to the control unit as a first result digital signal. And the control unit verifies the digital-to-analog converting function of the device under test on the basis of the first result digital signal.

In the test system, the test digital signal included in the predetermined test pattern is supplied to the device under test having the digital-to-analog converting function. The first comparator compares the output analog signal generated in the device under test with the first reference analog signal, thereby supplying the result of comparison to the control unit as a first result digital signal. The control unit verifies the digital-to-analog converting function of the device under test on the basis of the first result digital signal. This allows the memory tester to perform testing of the digital-to-analog converting function of the device under test.

Preferably, in the test system, the pin electronics further include a second digital-to-analog converter and a second comparator. Another predetermined digital value designated by the control unit is converted into a second reference analog signal by the second digital-to-analog converter to be input to one input terminal of the second comparator. The output analog signal generated in the device under test is input to the other input terminal of the second comparator. The second comparator compares the output analog signal generated in the device under test with the second reference analog signal, thereby supplying the result of comparison to the control unit as a second result digital signal. And the control unit verifies the digital-to-analog converting function of the device under test also on the basis of the second result digital signal.

In the test system, the second comparator compares the output analog signal generated in the device under test with the second reference analog signal, thereby supplying the result of comparison to the control unit as a second result digital signal. The control unit verifies the digital-to-analog converting function of the device under test also on the basis of the second result digital signal. Thus, setting the predetermined digital values different from each other such that the first and second reference analog signals have values different from each other allows the control unit to verify whether the output analog signal generated in the device under test has a value that falls within a range limited by the values of the respective reference analog signals.

A third aspect of the invention is directed to a testing method. The testing method uses a memory tester and a digital-to-analog converter. The memory tester includes a test pattern generating section for generating a predetermined test pattern to be supplied to a memory cell in each address in a memory device and a control unit for controlling the test pattern generating section. The digital-to-analog converter is one of digital-to-analog converters, one built in the memory tester and the other provided outside the memory tester. The testing method includes the steps of: (a) supplying the control unit with vector data; (b) generating the predetermined test pattern; (c) converting a test digital signal included in the predetermined test pattern into a test analog signal by the digital-to-analog converter; and (d) comparing, in the control unit, the test digital signal with an output digital signal generated in the device under test by converting the test analog signal, thereby verifying the analog-to-digital function of the device under test. The vector data is for generating the predetermined test pattern. The predetermined test pattern is generated in the test pattern generating section on the basis of the vector data. The test digital signal is converted to be supplied to a device under test having the analog-to-digital converting function.

With the method, a test digital signal included in the predetermined test pattern is converted into a test analog signal by the digital-to-analog converter to be supplied to the device under test. The control unit compares the test digital signal with the output digital signal generated in the device under test by converting the test analog signal, thereby verifying the analog-to-digital converting function of the device under test. This allows the memory tester to perform testing of the analog-to-digital converting function of the device under test.

Preferably, the testing method further uses a storage device for storing the output digital signal and outputting the signal to the control unit. The testing method further includes the step of (e) storing the output digital signal in the storage device.

With the method, the storage device for storing the output digital signal and outputting the signal to the control unit is further provided. Thus, the control unit does not need to make a real-time comparison between the output digital signal and the test digital signal.

Preferably, in the testing method, the storage device is provided in a fail bit analyzer for analyzing a failure position in the memory device when a failure is found in an output of the memory device.

With the method, the storage device is a memory provided in the FBA. Thus, there is no need to provide an additional storage device for the memory tester, but the memory provided inside the FBA which is generally built in the memory tester can be diverted for the storage device.

Preferably, in the testing method, the control unit, in the comparison between the output digital signal and the test digital signal, judges that analog-to-digital conversion functions normally in the device under test when the signals are different only within a predetermined range of numerical values.

With the method, the control unit, in the comparison between the output digital signal and the test digital signal, judges that analog-to-digital conversion functions normally in the device under test when the signals are different only within a predetermined range of numerical values. Thus, the percentage of devices under test passing a test can be increased by setting the predetermined range appropriately.

A fourth aspect of the invention is directed to another testing method. The testing method uses a memory tester and pin electronics. The memory tester includes a test pattern generating section for generating a predetermined test pattern to be supplied to a memory cell in each address in a memory device and a control unit for controlling the test pattern generating section. The pin electronics include a first digital-to-analog converter and a first comparator. The testing method includes the steps of: (a) supplying the control unit with vector data; (b) generating the predetermined test pattern; and (c) supplying a test digital signal included in the predetermined test pattern to a device under test having the digital-to-analog converting function. The vector data is for generating the predetermined test pattern. The predetermined test pattern is generated in the test pattern generating section on the basis of the vector data. In the testing method, a predetermined digital value designated by the control unit is converted into a first reference analog signal by the first digital-to-analog converter to be input to. one input terminal of the first comparator. An output analog signal generated in the device under test by converting the test digital signal is input to the other input terminal of the first comparator. The first comparator compares the output analog signal generated in the device under test with the first reference analog signal, thereby supplying the result of comparison to the control unit as a first result digital signal. The testing method further includes the step of (d) verifying the digital-to-analog converting function of the device under test in the control unit on the basis of the first result digital signal.

In the method, the test digital signal included in the predetermined test pattern is supplied to the device under test having the digital-to-analog converting function. The first comparator compares the output analog signal generated in the device under test with the first reference analog signal, thereby supplying the result of comparison to the control unit as a first result digital signal. The control unit verifies the digital-to-analog converting function of the device under test on the basis of the first result digital signal. This allows the memory tester to perform testing of the digital-to-analog converting function of the device under test.

Preferably, in the testing method, the pin electronics further include a second digital-to-analog converter and a second comparator. Another predetermined digital value designated by the control unit is converted into a second reference analog signal by the second digital-to-analog converter to be input to one input terminal of the second comparator. The output analog signal of the device under test is input to the other input terminal of the second comparator. The second comparator compares the output analog signal generated in the device under test with the second reference analog signal, thereby supplying the result of comparison to the control unit as a second result digital signal. And the control unit verifies the digital-to-analog converting function of the device under test also on the basis of the second result digital signal, in the step (d).

In the method, the second comparator compares the output analog signal generated in the device under test with the second reference analog signal, thereby supplying the result of comparison to the control unit as a second result digital signal. The control unit verifies the digital-to-analog converting function of the device under test also on the basis of the second result digital signal. Thus, setting the predetermined digital values different from each other such that the first and second reference analog signals have values different from each other allows the control unit to verify whether the output analog signal generated in the device under test has a value that falls within a range limited by the values of the respective reference analog signals.

These and other objects, features, aspects and advantages of the present invention will become more apparent from the following detailed description of the present invention when taken in conjunction with the accompanying drawings.

BRIEF DESCRIPTION OF THE DRAWINGS

FIG. 13 is a flow chart showing an operation of the memory tester; and

FIGS. 14 and 15 show examples of vector data.

DESCRIPTION OF THE PREFERRED EMBODIMENTS

First Preferred Embodiment

Figure 12:
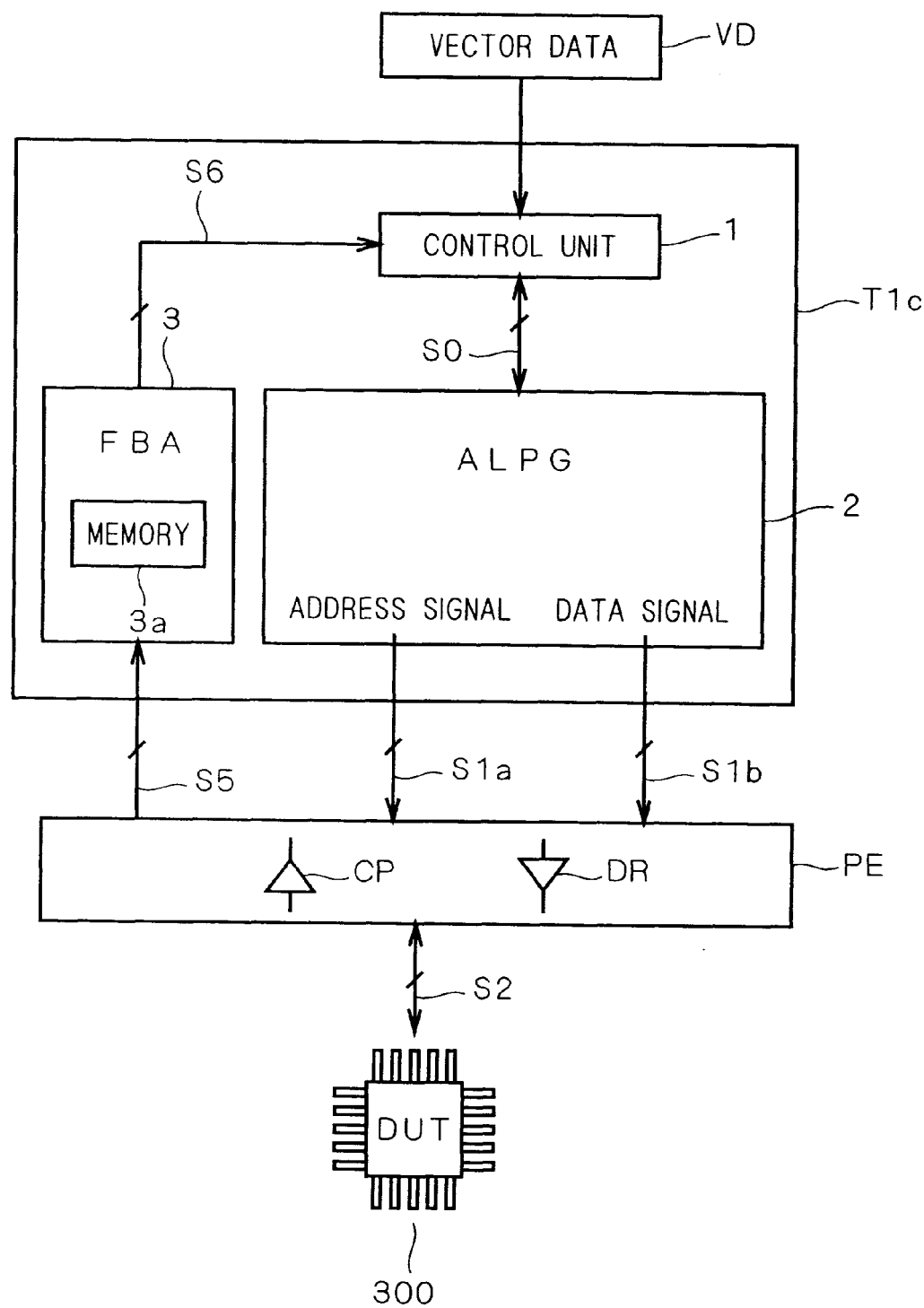
FIG. 12 illustrates a structure of a memory tester.

The present embodiment is directed to a test system and a testing method, in which a digital-to-analog (D/A) converter is built in or provided outside the memory tester shown in FIG. 12, so that the function of a device under test (DUT) having the analog-to-digital (A/D) converting function can be verified.

Figure 1:
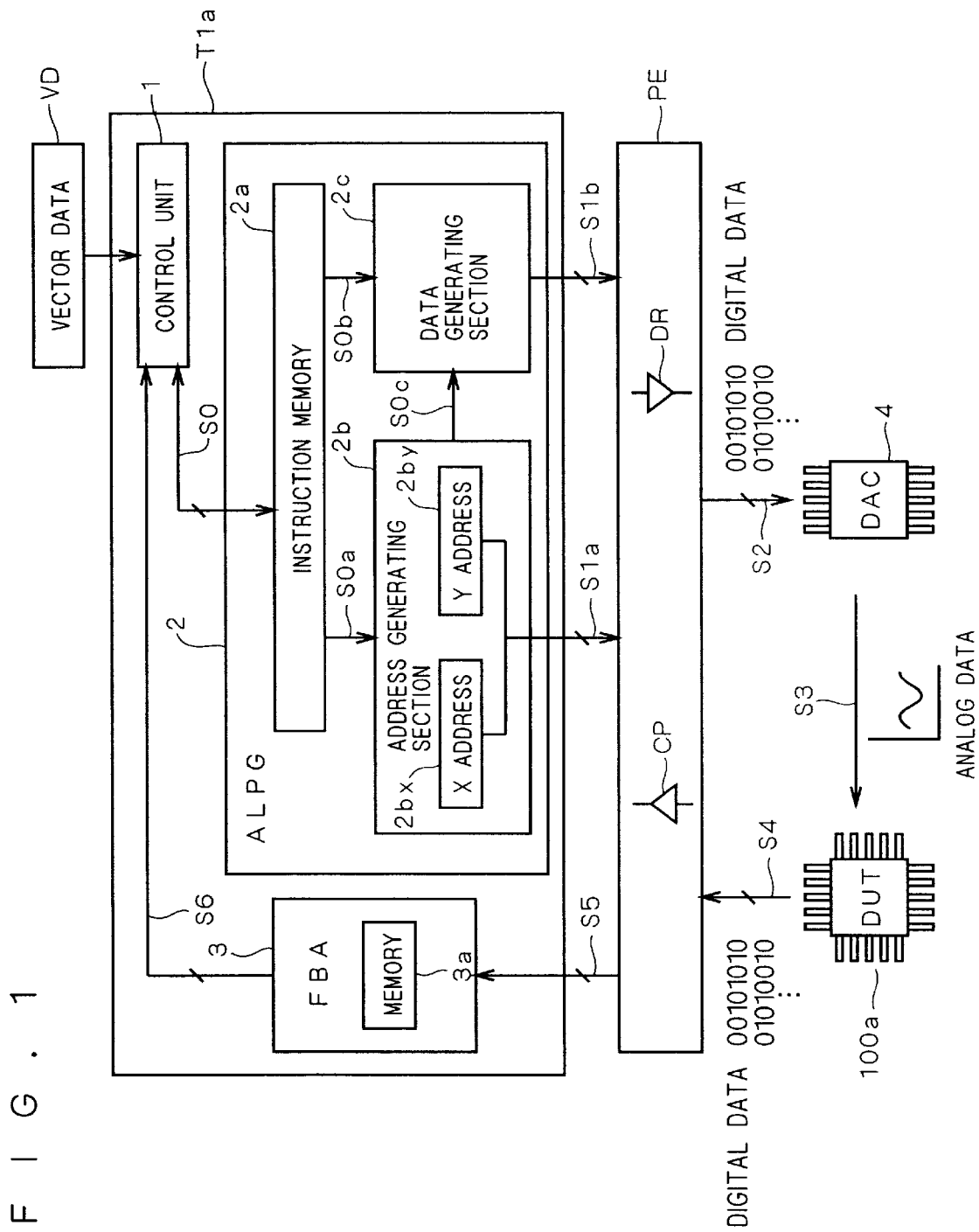
FIG. 1 illustrates a structure of a test system according to a first preferred embodiment of the present invention.

FIG. 1 illustrates a structure of the test system according to the present embodiment. A memory tester T1$a$ in this test system having the same structure as the memory tester T1$c$ shown in FIG. 12 comprises the control unit 1, the ALPG 2 for generating a test pattern as a digital signal on the basis of vector data VD and the FBA 3.

FIG. 1 illustrates the inner structure of the ALPG 2 in more detail. More specifically, the ALPG 2 includes an instruction memory 2$a$ for storing a control instruction included in the signal S0 from the control unit 1, an address generating section 2$b$ for generating the address signal S1$a$ and a data generating section 2$c$ for generating the data signal S1$b$.

The instruction memory 2$a$ supplies a signal S0$a$ to the address generating section 2$b$, where the address signal S1$a$ is generated on the basis of the signal S0$a$. On the other hand, the instruction memory 2$a$ supplies a signal S0$b$ and the address generating section 2$b$ further supplies a signal S0$c$ to the data generating section 2$c$, where the data signal S1$b$ is generated on the basis of the signals S0$b$ and S0$c$.

The address generating section 2$b$ is provided with an X address generating section 2$bx$ and a Y address generating section 2$by$, from which X and Y address signals are output, respectively, as the signal S1$a$. The X and Y address signals are, e.g., 8-bit digital signals also in the memory tester T1$a$ of the present embodiment similarly to those in the memory tester T1$c$ shown in FIG. 12.

The control unit 1, which represents a CPU or a DSP to which storing means (e.g., ROM and RAM) is connected, is a functional component operated by predetermined software programs stored in the ROM and RAM. The control unit 1 controls the ALPG 2 and the FBA 3.

A D/A converter 4 is connected to the memory tester T1$a$ through the same pin electronics PE as shown in FIG. 12. The D/A converter 4 may be built in the memory tester T1$a$ or may be provided outside the tester.

Building the D/A converter 4 in the memory tester T1$a$ means, for example, arranging the D/A converter 4 in the memory tester T1$a$ such that the address signal S1$a$ and data signal S1*b* as output signals are output to the outside through the D/A converter 4.

FIG. 1 shows the case in which the D/A converter 4 is provided outside the tester. Providing the D/A converter 4 outside the tester means, for example, diverting a D/A converter, if any, provided inside a DUT 100*a* which will be described next for the D/A converter 4, or providing the D/A converter 4 as a separate component.

The DUT 100*a* having the A/D converting function is connected to the D/A converter 4. Each signal from the ALPG 2 is transmitted to the D/A converter 4 through the pin electronics PE and subjected to D/A conversion in the D/A converter 4. Thereafter, the converted signal is input to the DUT 100*a* as an analog signal. The output digital signal S4 is output from the DUT 100*a* to the pin electronics, and the output signal is input to the FBA 3 through the pin electronics PE as the signal S5.

Figure 2:
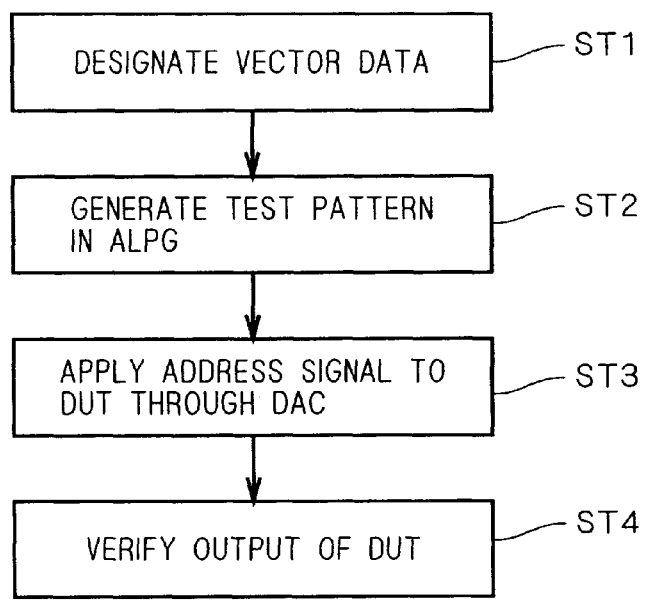
FIG. 2 is a flow chart showing an operation of the test system according to the first preferred embodiment.
Figures 13, 14:
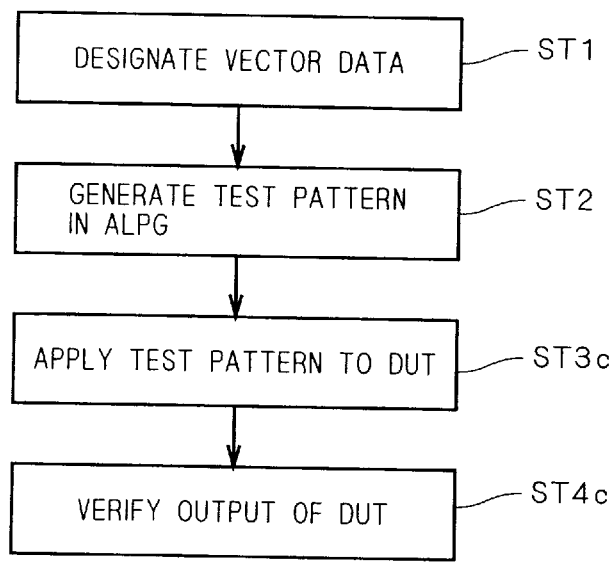

FIG. 2 is a flow chart showing an operation of the memory tester T1*a*, i.e., the testing method according to the present embodiment. First, a test pattern to be supplied to the DUT 100*a* is designated as vector data VD and is input to the control unit 1 (step ST1). The vector data may be data that designates the contents of data for each memory cell by "0" or "1" in binary as shown in FIG. 14 or may be data that designates the contents of data for each memory cell by applying a predetermined rule as shown in FIG. 15. In either type of data, X (row) and Y (column) addresses are designated by, e.g., 8 bits, respectively.

The ALPG 2 exchanges the signal S0 with the control unit 1, thereby receiving controlling information and information on vector data VD from the control unit 1 and providing the control unit 1 with information on the operating condition thereof. The ALPG 2 then generates a test pattern on the basis of the vector data VD (step ST2).

In the present embodiment, a data signal included in the test pattern generated on the basis of the vector data is not supplied to the DUT 100*a* but an address signal included in the test pattern is supplied to the DUT 100*a* through the D/A converter 4 as a test digital signal. In other words, 8-bit digital signals for designating X and Y addresses, for example, are not used for address designation, but for generation of an analog signal to be input to the DUT 100*a* having the A/D converting function.

That is, the address signal S1*a* as the test digital signal is supplied to the D/A converter 4, where it is converted into a test analog signal, and is thereafter applied to the DUT 100*a* (step ST3). The DUT 100*a* converts the test analog signal by the A/D converting function to generate an output digital signal S4. The output digital signal S4 is input to the control unit 1 through the pin electronics PE and the FBA 3.

The control unit 1 compares the output digital signal S4 generated in the DUT 100*a* with the address signal S1*a* as the test digital signal generated in the ALPG 2 to detect the degree of agreement between these signals, thereby verifying the A/D converting function of the DUT 100*a* (step ST4).

More specifically, with sequential generation of the address signal S1*a* that varies in time sequence in the ALPG 2, the variation is reflected on that in the analog signal S3 at an output terminal of the D/A converter 4. The variation in the analog signal S3 in time sequence is subjected to A/D conversion in the DUT 100*a*, so that the analog signal S3 is returned to a digital signal that varies in time sequence. The control unit 1 monitors whether the address signal S1*a* generated sequentially in the ALPG 2 and the output digital signal S4 output sequentially from the DUT 100*a* are in agreement. This monitoring enables verification of the A/D converting function of the DUT 100*a*.

As has been described, in the test system and the testing method according to the present embodiment, the address signal S1*a* as the test digital signal is converted into the test analog signal by the D/A converter 4 and is supplied to the DUT 100*a*. The control unit 1 then compares the address signal S1*a* with the output digital signal S4 generated in the DUT 100*a* by converting the test analog signal, thereby verifying the A/D converting function of the DUT 100*a*. This monitoring permits testing of the A/D converting function of the DUT 100*a*.

The above-described operation is easily achievable by adding modifications to the predetermined software programs stored in the ROM and RAM in the control unit 1.

Second Preferred Embodiment

The present embodiment is a variant of the test system and the testing method according to the first embodiment, in which the data signal S1*b* is supplied to the DUT 100*a* through the D/A converter 4 as a test digital signal instead of the address signal S1*a* included in the test pattern.

The data signal S1*b* included in a test pattern, although inherently intended to supply information to a memory cell in each address in a memory device, is used as a test digital signal for the DUT 100*a* having the A/D converting function. The test system according to the present embodiment has the same structure as the memory tester T1*a* of the first embodiment, explanation of which is thus omitted here.

Figure 3:
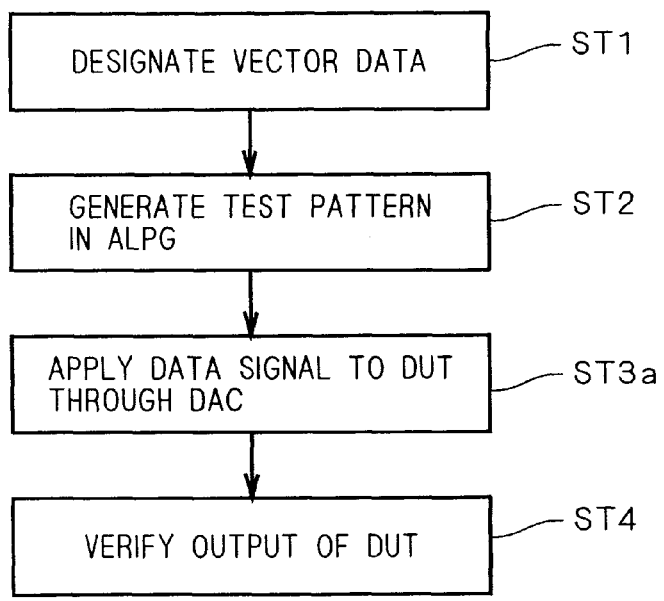
FIG. 3 is a flow chart showing an operation of a test system according to a second preferred embodiment of the invention.

FIG. 3 is a flow chart showing an operation of the test system of the present embodiment, i.e., the testing method of the present embodiment. The steps ST1 and ST2 are the same as those in FIG. 2, at which a test pattern to be supplied to the DUT 100*a* is designated as vector data VD and is input to the control unit 1 (step ST1). The vector data may be data that designates the contents of data for each memory cell by "0" or "1" in binary as shown in FIG. 14 or may be data that designates the contents of data for each memory cell by applying a predetermined rule as shown in FIG. 15. In either type of data, data signals containing 8 bits, for example, constitute a group of test digital signals.

The ALPG 2 exchanges the signal S0 with the control unit 1, thereby receiving controlling information and information on the vector data VD from the control unit 1 and providing the control unit 1 with information on the operating condition thereof. The ALPG 2 then generates a test pattern on the basis of the vector data VD (step ST2).

In the present embodiment, the data signal S1*b* included in the test pattern generated on the basis of the vector data is supplied to the DUT 100*a* through the D/A converter 4 as a test digital signal. In other words, 8-bit data signals are not used for designation of data to be input to a memory cell, but for generation of an analog signal to be input to the DUT 100*a* having the A/D converting function.

That is, the data signal S1*b* as the test digital signal is supplied to the D/A converter 4, where it is converted into a test analog signal, and the test analog signal is thereafter applied to the DUT 100*a* (step ST3*a*). The DUT 100*a* converts the test analog signal by the A/D converting function to generate the output digital signal S4. The output digital signal S4 is input to the control unit 1 through the pin electronics PE and the FBA 3.

The control unit 1 then compares the time series variation in the output digital signal S4 generated in the DUT 100*a* with that of the data signal generated in the ALPG 2 to detect the degree of agreement between these signals, thereby verifying the A/D converting function of the DUT 100a (step ST4).

As described above, the use of a data signal as a test digital signal instead of an address signal achieves the same effects as those achieved by the test system and the testing method of the first embodiment.

Third Preferred Embodiment

The present embodiment is another variant of the test system and the testing method of the first embodiment, in which a memory (fail bit memory) 3a provided in the FBA 3 is diverted for temporal storing of a time series variation in the output digital signal from the DUT 100a. In other words, the memory 3a in the FBA 3 which is generally built in the memory tester is diverted for temporal storing of the output digital signal with no need to provide additional storing means for the test system, so that the control unit 1 does not make a real-time comparison between the output digital signal and the test digital signal. As a result, processing burdens on the control unit 1 can be reduced.

Figure 4:
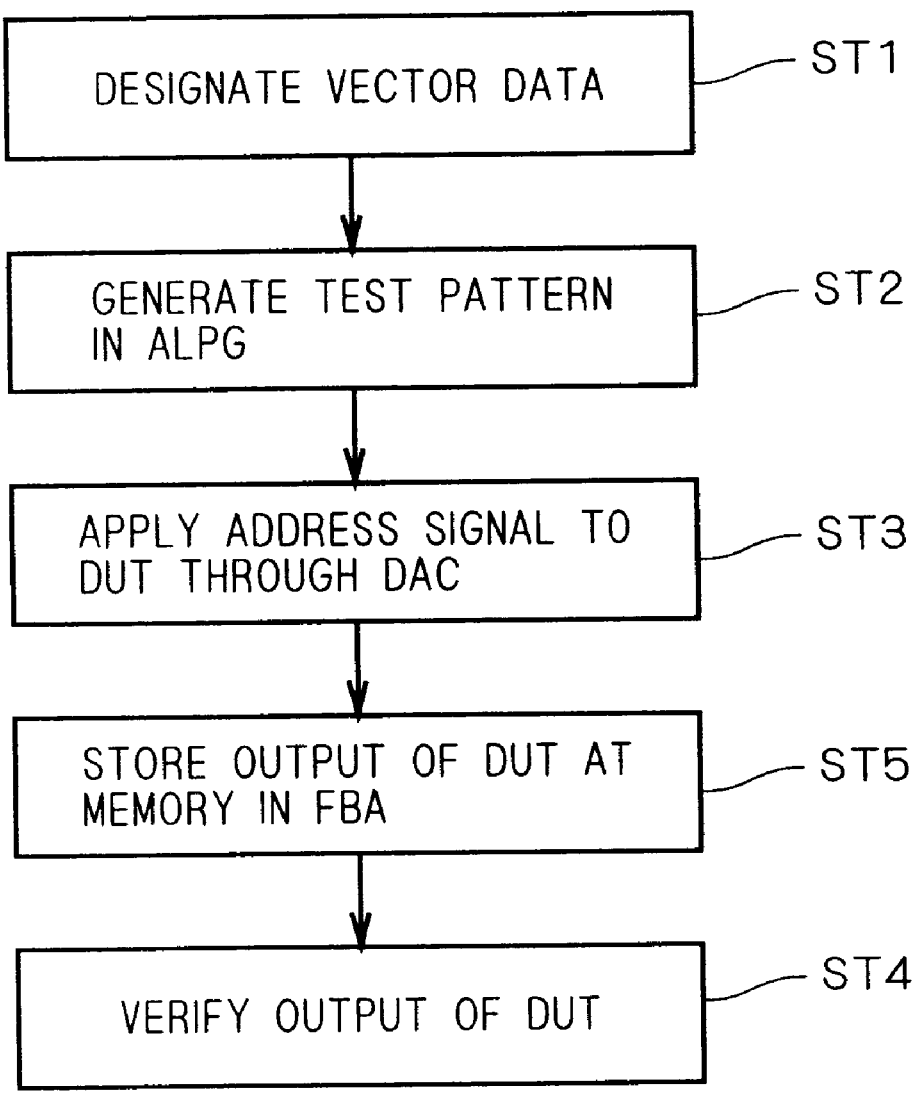
FIG. 4 is a flow chart showing an operation of a test system according to a third preferred embodiment of the invention.

FIG. 4 is a flow chart showing an operation of the test system of the present embodiment, i.e., the testing method of the present embodiment. A step ST5 for storing and holding the output digital signal S4 of the DUT 100a (the signal S5 after passing through the pin electronics PE) at the memory 3a in the FBA 3 is added between the steps ST3 and ST4 shown in the flow chart of FIG. 2.

The test system of the present embodiment is similar to that of the first embodiment in structure and other operation steps, explanations of which are thus omitted here.

According to the test system and the testing method of the present embodiment, storing means for storing an output digital signal of the DUT 100a and outputting the signal to the control unit 1 is further provided. The storing means is the memory 3a provided in the FBA 3. Thus, the control unit 1 does not need to make a real-time comparison between the output digital signal and the test digital signal. Further, there is no need to provide additional storing means for the test system, but the memory in the FBA 3 which is generally built in a memory tester can be diverted for the storing means.

Fourth Preferred Embodiment

The present embodiment is still another variant of the test system and the testing method of the first embodiment. In the comparison between an output digital signal of the DUT 100a and a test digital signal generated in the ALPG 2, judgment is made that A/D conversion functions normally in the DUT 100a when the two signals are different only within a predetermined range of numerical values.

An analog signal is considered acceptable in many cases even when its value differs from an ideal one to some degree. In the present embodiment, judgment is therefore made that the A/D conversion functions normally in the DUT 100a even when the output digital signal subjected to A/D conversion in the DUT 100a has a value different from that of the test digital signal generated in the ALPG 2 to some degree.

Figure 5:
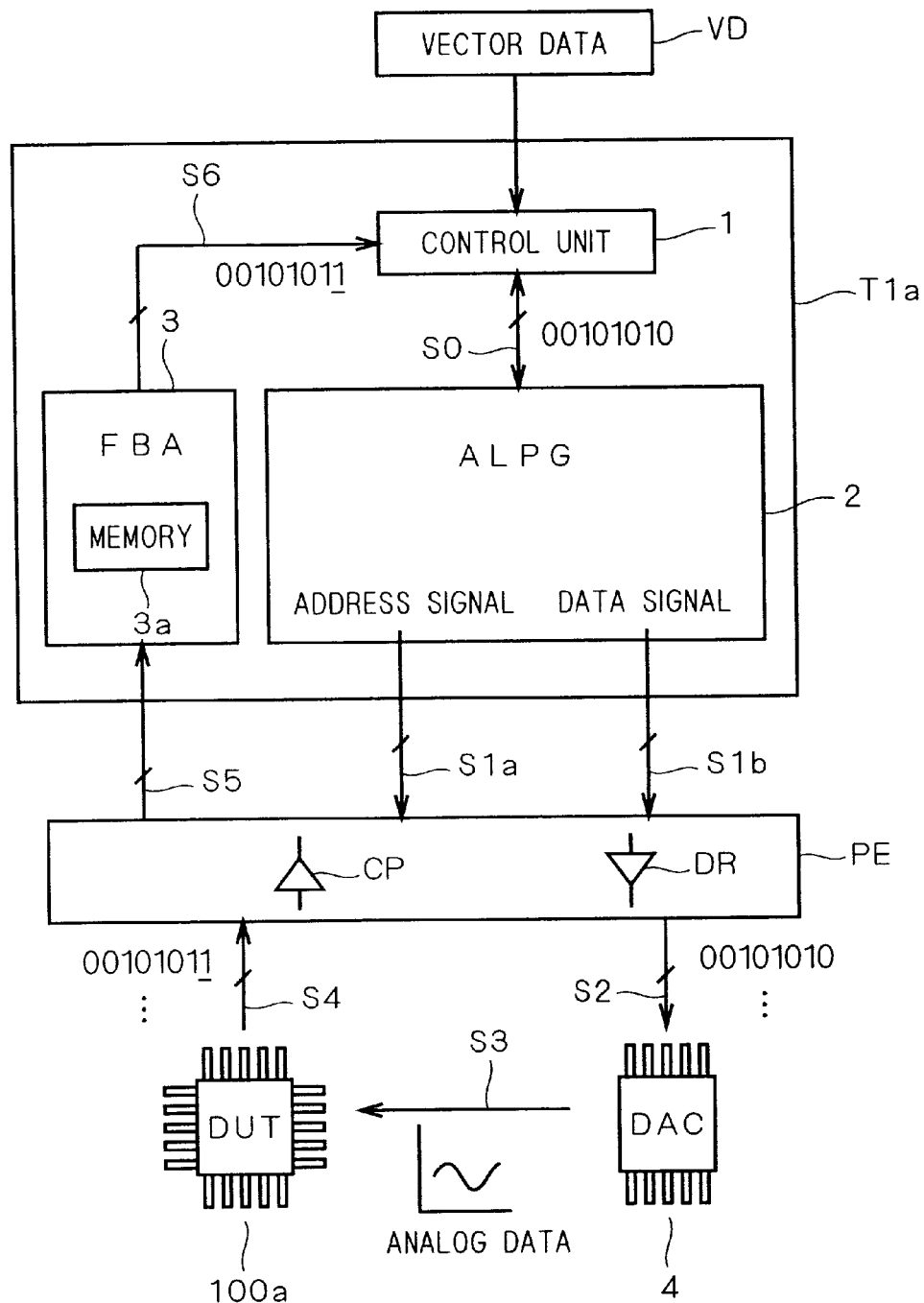
FIG. 5 shows concrete examples of numerical values of digital signals in the test system shown in FIG. 4.

FIG. 5 shows concrete examples of numerical values of digital signals in the test system according to the present embodiment. Assume that an 8-bit digital signal generated in the ALPG 2 is represented by "00101010" as indicated by the signal S2, for instance. Description will be made on the case that the test digital signal is supplied to the DUT 100a through the D/A converter 4 where it is subjected to A/D conversion, resulting in generation of the output digital signal S4 represented by "00101011" having a least significant bit (LSB) different from that of the test digital signal.

In this case, the control unit 1 according to the first to third embodiments inevitably judges that A/D conversion does not function normally in the DUT 100a due to the difference in numerical values between the output digital signal represented by "00101011" and the test digital signal represented by "00101010".

To prevent this, the control unit 1 of the present embodiment judges that A/D conversion functions normally in the DUT 100a when the output digital signal of the DUT 100a has an LSB different from that of the test digital signal only by ±1, for example.

More specifically, in the case that the test digital signal is represented by "00101010", the control unit 1 of the present embodiment judges that A/D conversion functions normally in the DUT 100a when the DUT 100a outputs a signal represented by either "00101011" or "00101001" with an LSB different from that of the test digital signal only by ±1 as well as a signal represented by "00101010".

The above-described operation is generally called "parallel match", which is easily achievable by adding modifications to the predetermined software programs stored in ROM and RAM in the control unit 1.

Figure 6:
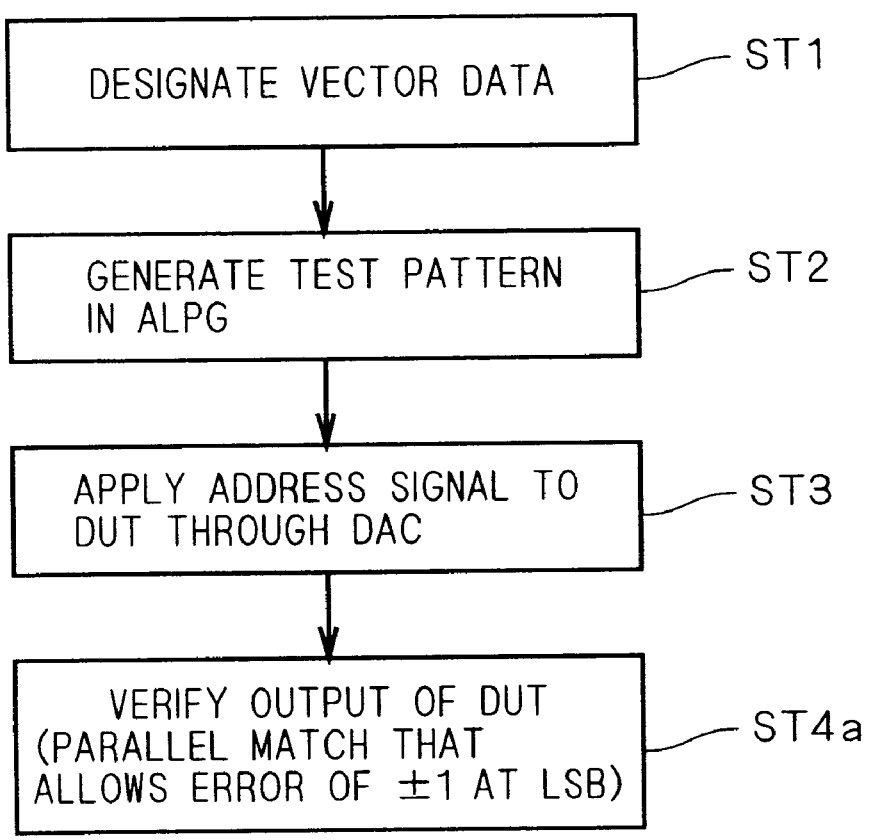
FIG. 6 is a flow chart showing an operation of a test system according to a fourth preferred embodiment of the invention.

FIG. 6 is a flow chart showing an operation of the test system of the present embodiment, i.e., the testing method of the present embodiment. As shown in FIG. 6, employed instead of the step ST4 shown in the flow chart of FIG. 2 is a step ST4a in which the control unit 1 verifies an output of the DUT 100a while exerting the function of parallel match that allows an error of ±1 at an LSB.

The test system of the present embodiment is similar to that of the first embodiment in structure and other operation steps, explanations of which are thus omitted here.

According to the test system and the testing method of the present embodiment, in the comparison between an output digital signal and a test digital signal, judgment is made that A/D conversion functions normally in the DUT 100a when the two signals are different only by ±1 at LSB. Therefore, the percentage of DUTs passing a test can be increased by setting an allowable range appropriately.

Fifth Preferred Embodiment

The present embodiment is directed to a test system and a testing method, in which modifications are added to the comparator included in the pin electronics in the structure of the memory tester shown in FIG. 12, so that the function of a device under test (DUT) having the D/A converting function can be verified.

Figure 7:
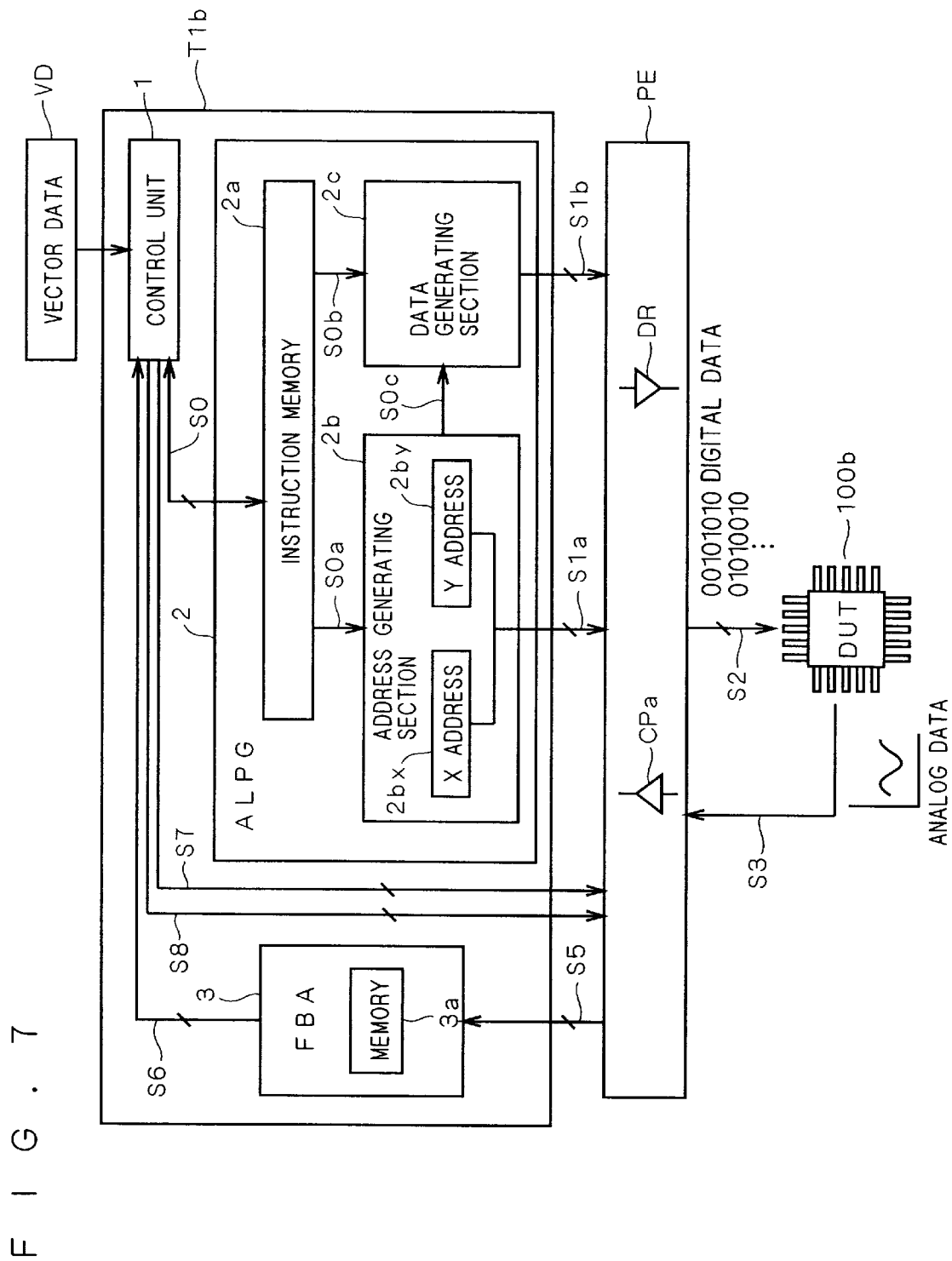
FIG. 7 illustrates a structure of a test system according to a fifth preferred embodiment of the invention.

FIG. 7 illustrates a structure of the test system according to the present embodiment. A memory tester T1b in the test system has the same structure as the memory tester T1a shown in FIG. 1 and the memory tester T1c shown in FIG. 12, comprising the control unit 1, the ALPG 2 for generating a test pattern as a digital signal on the basis of vector data VD and the FBA 3.

However, the test system of the present embodiment, intended to verify a DUT 100b having the D/A converting function, is not provided with the D/A converter 4 unlike the system shown in FIG. 1. Instead, the signal S2 from the pin electronics PE is directly input to the DUT 100b as the test digital signal. An output analog signal S3 from the DUT 100b is output to the pin electronics PE.

The signal S2 as the test digital signal varies in time sequence similarly to the first to fourth embodiments. As a result, the output analog signal S3 of the DUT 100b is an analog signal that varies in time sequence.

In the present embodiment, a comparator CPa included in the pin electronics PE is utilized to verify whether the output analog signal S3 of the DUT 100b has a desirable value.

Figure 8:
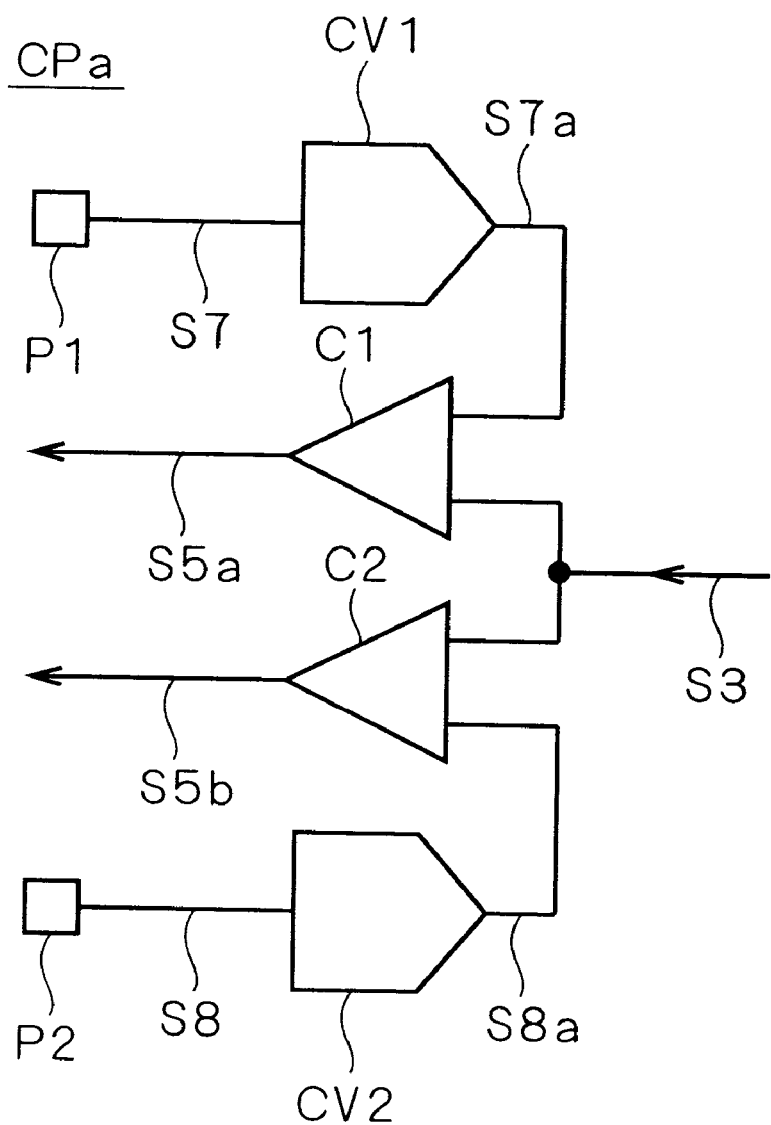
FIG. 8 illustrates a structure of a comparator included in pin electronics of the test system according to the fifth preferred embodiment.
Figure 11:
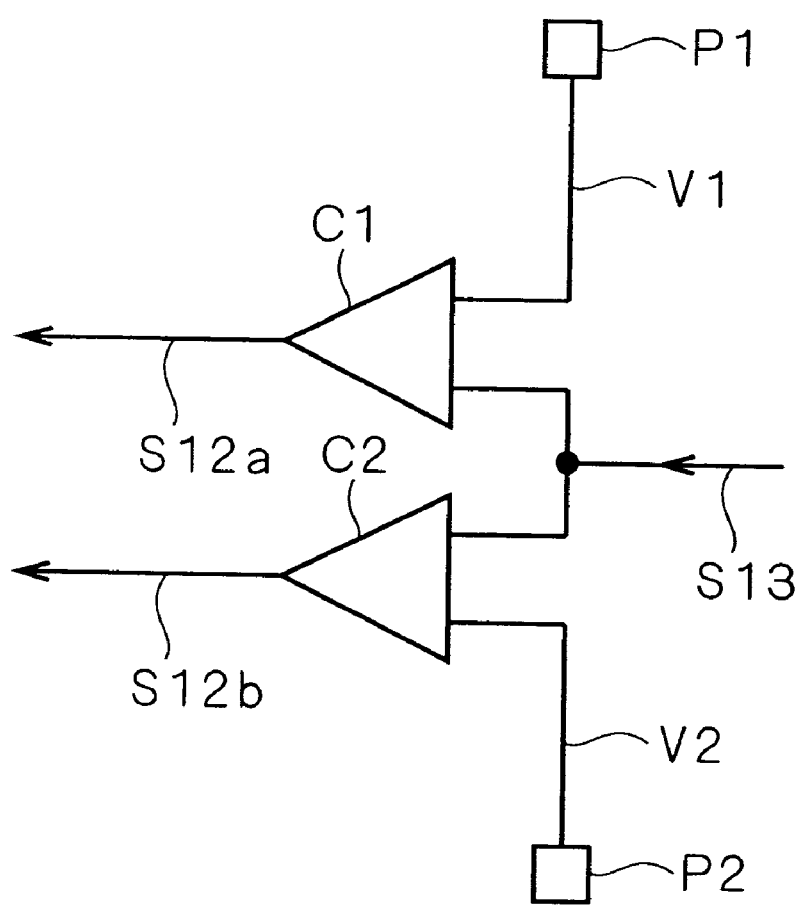
FIG. 11 illustrates a structure of the comparator included in the pin electronics.

FIG. 8 illustrates a structure of the comparator CPa according to the present embodiment. The comparator CPa includes the High-side comparator C1 and the Low-side comparator C2 similarly to the conventional comparator CP shown in FIG. 11. The output analog signal S3 of the DUT 100b is supplied to one side input terminals of the High-side comparator C1 and the Low-side comparator C2.

Unlike the conventional comparator CP, however, the comparator CPa includes a High-side D/A converter CV1 provided between the High-side pad P1 and the other input terminal of the High-side comparator C1 and a Low-side D/A converter CV2 provided between the Low-side pad P2 and the other input terminal of the Low-side comparator C2. Input to the High-side pad P1 is a signal S7 having a predetermined digital value designated by the control unit 1. Input to the Low-side pad P2 is a signal S8 having another predetermined digital value designated by the control unit 1.

Input to the other input terminal of the High-side comparator C1 is a High-side reference analog signal S7a generated by performing D/A conversion of the signal S7. On the other hand, input to the other terminal of the Low-side comparator C2 is a Low-side reference analog signal S8a generated by performing D/A conversion of the signal S8.

In the conventional comparator CP, potentials at the both terminals of the voltage source VS are supplied to the pads P1 and P2 as the first and second reference potentials V1 and V2, respectively. In the comparator CPa of the present embodiment, however, the signals S7 and S8 having the digital values designated by the control unit 1 as described above are input to the pads P1 and P2. This is because the High-side comparator C1 and the Low-side comparator C2 are intended to verify whether the output analog signal S3 of the DUT 100b falls within a desirable range of values.

More specifically, assuming that the output analog signal S3 of the DUT 100b has an expected voltage value of, e.g., 4.0[V], the control unit 1 generates the signal S7 having such a digital value that the High-side reference analog signal S7a has a voltage value of, e.g., 4.2[V], and generates the signal S8 having such a digital value that the Low-side reference analog signal S8a has a voltage value of, e.g., 3.8[V].

The High-side and Low-side comparators C1 and C2 compare the output analog signal S3 of the DUT 100b with the High-side and Low-side reference analog signals S7a and S8a, respectively, thereby supplying the results of comparison as result digital signals S5a and S5b (both included in the signal S5 in FIG. 7), respectively, to the control unit 1 through the FBA 3. The control unit 1 verifies the D/A converting function of the DUT 100b on the basis of the contents of the result digital signal S5.

With such structure, assuming that the output analog signal S3 actually has a voltage value of, e.g., 4.5[V], the Low-side comparator C2 can detect that the voltage value of the output analog signal S3 does not fall below 3.8[V] while the High-side comparator C1 can detect that it exceeds 4.2[V]. In other words, the control unit 1 sets appropriate maximum and minimum values for the High-side signal S7 and the Low-side signal S8, respectively, as digital values, thereby making it possible to detect whether the voltage value of the output analog signal S3 falls within a predetermined range. Needless to say, the setting of the maximum and minimum values is carried out at the control unit 1 appropriately in accordance with the variation in the value of the test digital signal generated in the ALPG 2.

Figure 9:
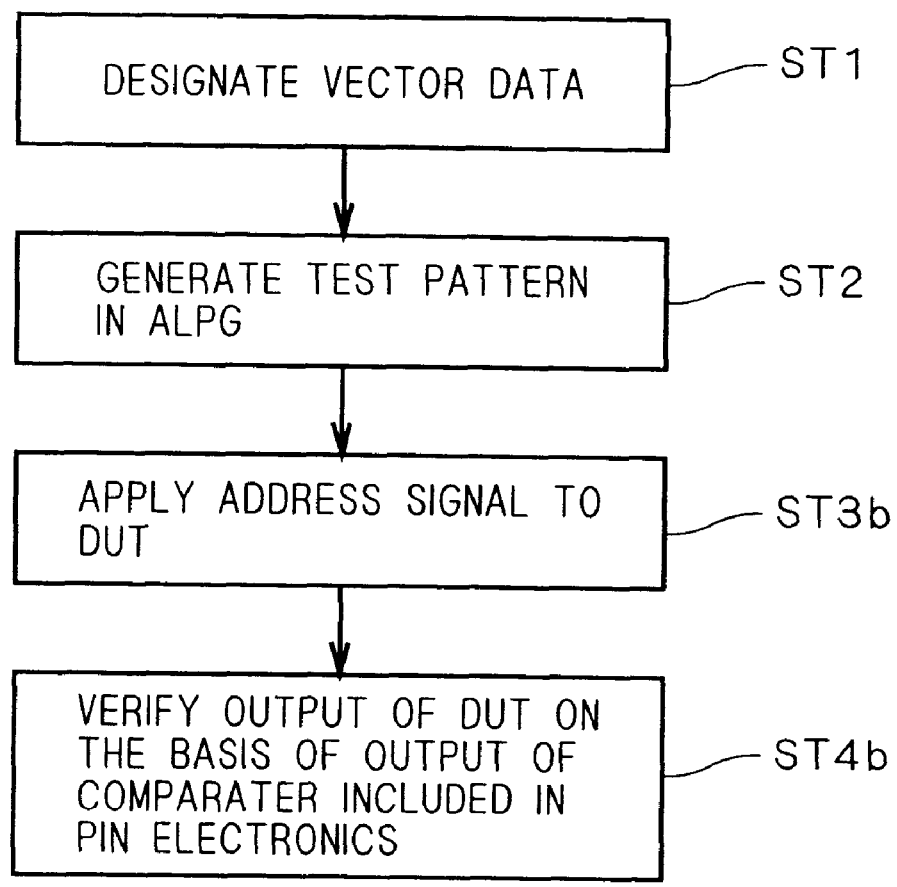
FIG. 9 is a flow chart showing an operation of the test system according to the fifth preferred embodiment.
Figure 10:
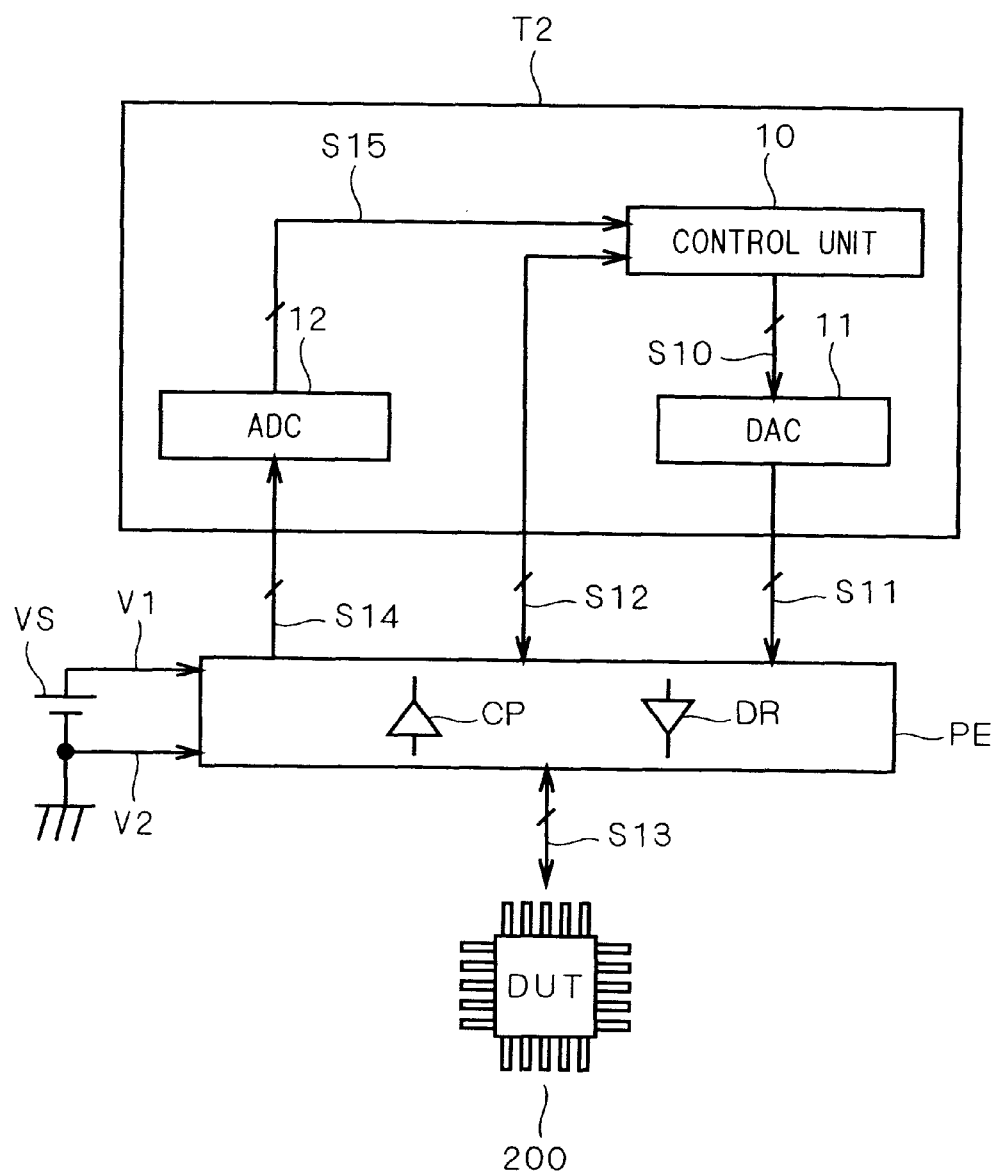
FIG. 10 illustrates a structure of a mixed signal tester.

FIG. 9 is a flow chart showing an operation of the test system of the present embodiment, i.e., the testing method of the present embodiment. The steps ST1 and ST2 are the same as those in FIG. 2, at which a test pattern to be supplied to the DUT 100b is designated as vector data VD and is input to the control unit 1 (step ST1). The vector data may be data that designates the contents of data for each memory cell by "0" or "1" in binary as shown in FIG. 14 or may be data that designates the contents of data for each memory cell by applying a predetermined rule as shown in FIG. 15.

The ALPG 2 exchanges the signal S0 with the control unit 1, thereby receiving controlling information and information on the vector data VD from the control unit 1 and providing the control unit 1 with information on the operating condition thereof. The ALPG 2 then generates a test pattern on the basis of the vector data VD (step ST2).

Next, in the present embodiment, an address signal included in the test pattern generated on the basis of the vector data is supplied to the DUT 100b as a test digital signal (step ST3b).

The DUT 100b performs DIA conversion of the test digital signal to generate the output analog signal S3. Lastly, the control unit 1 detects whether the voltage value of the output analog signal S3 falls within a predetermined range on the basis of the outputs of the High-side and Low-side comparators C1 and C2 (step ST4b).

According to the present embodiment, the test digital signal included in the test pattern generated in the ALPG 2 is supplied to the DUT 100b having the D/A converting function. The High-side and Low-side comparators C1 and C2 compares the output analog signal S3 of the DUT 100b with the High-side and Low-side reference analog signals S7a and S8a, respectively, thereby supplying the results of comparison to the control unit 1. The control unit 1 verifies the D/A converting function of the DUT 100b on the basis of the results of comparison. This permits testing of the DIA converting function of the DUT in the memory tester.

Although an address signal is employed as the test digital signal in the above-described case, a data signal may be employed as a matter of course.

Further, both of the High-side and Low-side comparators C1 and C2 are provided in the above-described case, however, either one of the comparators may be provided, for example. In this case, processing is simplified although judgment is made only whether the voltage value of the output analog signal is greater or smaller than a predetermined value designated by the control unit 1.

When both of the High-side and Low-side comparators C1 and C2 are provided as described above, supplying the respective comparators with reference analog signals different from each other in voltage value allows the control unit 1 to verify whether the output analog signal of the DUT has a value that falls within a range limited by the voltage values of the respective reference analog signals.

While the invention has been shown and described in detail, the foregoing description is in all aspects illustrative and not restrictive. It is therefore understood that numerous modifications and variations can be devised without departing from the scope of the invention.

What is claimed is:

1. A test system comprising:

a memory tester including a test pattern generating section for generating a predetermined test pattern to be supplied to a memory cell in each address in a memory device and a control unit for controlling said test pattern generating section; and a digital-to-analog converter being one of digital-to-analog converters, one built in said memory tester and the other provided outside said memory tester, wherein said control unit is supplied with vector data for generating said predetermined test pattern, said test pattern generating section generates said predetermined test pattern on the basis of said vector data, a test digital signal included in said predetermined test pattern is converted into a test analog signal by said digital-to-analog converter to be supplied to a device under test having the analog-to-digital converting function, and said control unit compares said test digital signal with an output digital signal generated in said device under test by converting said test analog signal, thereby verifying the analog-to-digital converting function of said device under test.

2. The test system according to claim 1, wherein said test digital signal is an address signal with said predetermined test pattern.

3. The test system according to claim 1, wherein said test digital signal is a data signal with said predetermined test pattern.

4. The test system according to claim 1, further comprising means for storing said output digital signal and outputting said signal to said control unit.

5. The test system according to claim 4, wherein said storing means is a memory provided in a fail bit analyzer for analyzing a failure position in said memory device when a failure is found in an output of said memory device.

6. The test system according to claim 1, wherein said control unit, in the comparison between said output digital signal and said test digital signal, judges that analog-to-digital conversion functions normally in said device under test when said signals are different only within a predetermined range of numerical values.

7. A test system comprising:

a memory tester including a test pattern generating section for generating a predetermined test pattern to be supplied to a memory cell in each address in a memory device and a control unit for controlling said test pattern generating section, and pin electronics including a first digital-to-analog converter and a first comparator, wherein said control unit is supplied with vector data for generating said predetermined test pattern, said test pattern generating section generates said predetermined test pattern on the basis of said vector data, a test digital signal included in said predetermined test pattern is supplied to a device under test having the digital-to-analog converting function, a predetermined digital value designated by said control unit is converted into a first reference analog signal by said first digital-to-analog converter to be input to one input terminal of said first comparator, an output analog signal generated in said device under test by converting said test digital signal is input to the other input terminal of said first comparator, said first comparator compares said output analog signal generated in said device under test with said first reference analog signal, thereby supplying the result of comparison to said control unit as a first result digital signal, and said control unit verifies the digital-to-analog converting function of said device under test on the basis of said first result digital signal.

8. The test system according to claim 7, wherein said pin electronics further include a second digital-to-analog converter and a second comparator, another predetermined digital value designated by said control unit is converted into a second reference analog signal by said second digital-to-analog converter to be input to one input terminal of said second comparator, said output analog signal generated in said device under test is input to the other input terminal of said second comparator, said second comparator compares said output analog signal generated in said device under test with said second reference analog signal, thereby supplying the result of comparison to said control unit as a second result digital signal, and said control unit verifies the digital-to-analog converting function of said device under test also on the basis of said second result digital signal.

9. The test system according to claim 7, wherein said test digital signal is an address signal with said predetermined test pattern.

10. The test system according to claim 7, wherein said test digital signal is a data signal with said predetermined test pattern.

* * * * *